US006769091B2

United States Patent
Classon et al.

(10) Patent No.: US 6,769,091 B2
(45) Date of Patent: Jul. 27, 2004

(54) ENCODING METHOD AND APPARATUS USING SQUISHED TRELLIS CODES

(75) Inventors: Brian Classon, Palatine, IL (US); Vipul Anil Desai, Palatine, IL (US); John Johnson, Spring Grove, IL (US); Yufei Wu Blankenship, Streamwood, IL (US)

(73) Assignee: Motorola, Inc., Schaumburg, IL (US)

( * ) Notice: Subject to any disclaimer, the term of this patent is extended or adjusted under 35 U.S.C. 154(b) by 443 days.

(21) Appl. No.: 09/982,326

(22) Filed: Oct. 17, 2001

(65) Prior Publication Data

US 2002/0066061 A1 May 30, 2002

Related U.S. Application Data

(60) Provisional application No. 60/241,103, filed on Oct. 17, 2000.

(51) Int. Cl.[7] ........................ H03M 13/03; H03M 13/00
(52) U.S. Cl. ....................................... 714/792; 714/774
(58) Field of Search ............................... 714/792, 774

(56) References Cited

U.S. PATENT DOCUMENTS

| | | | | |
|---|---|---|---|---|
| 5,768,613 A | * | 6/1998 | Asghar ........................ | 712/35 |
| 6,128,322 A | * | 10/2000 | Rasanen et al. ............. | 370/536 |
| 6,216,107 B1 | * | 4/2001 | Rydbeck et al. ............. | 704/500 |
| 6,256,487 B1 | * | 7/2001 | Bruhn .......................... | 455/352 |
| 6,442,176 B1 | * | 8/2002 | Yahagi ......................... | 370/474 |
| 2002/0006138 A1 | * | 1/2002 | Odenwalder ................. | 370/468 |

OTHER PUBLICATIONS

Stanley J. Simmons; "Breadth–First Trellis Decoding with Adaptive Effort"; IEEE Transactions on Communications, vol. 38, No. 1, Jan. 1990; pp. 3–12.
Peter A. Bengough and Stanley J. Simmons; Sorting–Based VLSI Architectures for the M–algorithm and T–algorithm Trellis Decoders; IEEE Transactions on Communications, vol. 43, No. 2/3/4, Feb./Mar./Apr., 1995, pp. 514–522.

\* cited by examiner

Primary Examiner—Albert Decady
Assistant Examiner—Joseph D. Torres
(74) Attorney, Agent, or Firm—Kenneth A. Haas

(57) ABSTRACT

A squished trellis encoder encodes blocks of information with unequal error correction. A multiplexing switch partitions the information block into a first portion and a second portion. A first trellis encoder encodes the first portion. A second trellis encoder encodes the second portion. An initial state information generator maps the states of the first trellis encoder to the second trellis encoder to establish initial conditions for the states of the second trellis encoder. A delay delays the second portion from processing by the second trellis encoder until the initial state information generator has mapped the states. An associated decoder can use the novel squished approach or other alternative approaches.

10 Claims, 3 Drawing Sheets

ENCODING METHOD AND APPARATUS USING SQUISHED TRELLIS CODES

CLAIM OF PRIORITY

The present invention claims priority to the Oct. 17, 2000 filing date of the U.S. Provisional Application No. 60/241,103.

BACKGROUND OF THE INVENTION

1. Related Art
2. Description of the Related Art

Communication systems often use compression techniques for services such as voice and video. Because these compression techniques are non-ideal, the transmitted bits of data can have different importance to the end user. For voice, this is because certain audible artifacts are perceived differently than others by the human mind. To exploit this, many wireless systems employ unequal error protection (UEP) instead of equal error protection (EEP) when transmitting information. These systems advantageously provide more error protection to the bits that are the most perceptually significant, thus limiting the degradation caused by channel impairments such as noise and interference. In systems such as the GSM cellular standard, speech bits are ranked and categorized based on significance. Bits that are perceptually significance are classified as class 1 bits and are coded while less significant bits are labeled as class 2 bits and are uncoded. The class 1 bits can also be partitioned into classes such as class 1a and class 1b bits.

FIG. 1 illustrates a schematic block diagram of a prior art unequal error protection encoder for speech-coded information block. Speech bits 100 are one type of information block. A multiplexing switch 120 partitions the speech bits 100 into two classes of information blocks, a class 1 block 130 and a class 2 block 140. The multiplexing switch 120 partitions the speech bits 100 using human perceivable characteristics. The class 1 block 130 represents a portion of information that is perceptually more important. In FIG. 1, the class 1 block 130 is encoded using a convolutional encoder 160 and a puncture block 170 channel coding scheme. The class 2 block 140 represents perceptually less important portions of information and channel coding scheme for the class 2 block 140 is not to perform any coding. The output of the puncture block 170 and the class 2 block 140 are then combined using a multplexer 180 to produce an information block with unequal error protection 190.

Although the prior art does provide acceptable performance for several speech applications, there are drawbacks with the prior art. The complexity of the decoder for the convolutional encoder is related to the number of states in the convolutional encoder and the number of class 1 bits. When complexity is a factor in the design of the decoder, to use the prior art, the number of states in the convolutional encoder may have to be reduced so that complexity constraints can be satisfied. However, reducing the number of states can reduce the error protection capability of the convolutional code, thereby possibly degrading the performance of the code.

Another drawback of the prior art is that the puncture block may become very complicated to implement and/or store its puncturing pattern. The complexity of the puncture block can thereby undesirably increase. A larger puncture pattern can undesirably increase memory requirements. A further drawback of the prior art is that in order to protect all of the bits, parts of the trellis (e.g., convolutional code) are often severely punctured. Such weak coding can act as an error generator in poor channel conditions.

Several other unequal error protection methods exist but the decoders for these methods have drawbacks. Two such methods are the known M and T-reduced state algorithms. Both algorithms perform all valid branch calculations in a trellis stage and then sort the resulting path metrics. The M algorithm keeps the best M states. The T algorithm keeps all states with path metrics within T of the best path metric. Unfortunately, while the M and T algorithms greatly reduce path storage in the decoder, the operation complexity may not be decreased as compared to the non-reduced state (e.g., conventional decoder) algorithm.

Another possible unequal error protection method is to two separate convolutional codes, one for the class 1 and 1b bits and the previously uncoded bits. But this has drawbacks and do not solve the problem of low complexity. For example, a strong trellis code, such as a 64-state convolutional code, could be used for the first code and a weak trellis code, such as a 16-state convolutional code, could be used for the second code while satisfying the complexity constraints. In addition, this method can incorporate the puncturing to provide unequal error protection within each code. However, one issue with the use of two separate codes is that there is a significant increase in the overhead for the code. In general, convolutional codes are tailed (forced to state zero) after the information block has been encoded to improve decoder performance at the expense of overhead. Tailing adds m bits of overhead for a $2^m$-state convolutional code. Thus when two separate convolutional codes are used with individual tailing requirements of $m_0$ and $m_1$ bits, the combined overhead increases to $m_0+m_1$. This overhead, in some applications, can be difficult to eliminate. Another method that can use multiple codes for unequal error protection and that eliminates the overhead due to tailing is to use a tail-biting technique. However, a major disadvantage of the tail-biting is that decoding complexity can triple over conventional decoding.

Therefore, there is a need for a unequal error protection coding method using several convolutional codes with several numbers of states with fewer tail bits than required for full tailing of the codes and a joint decoder for the codes on a single trellis with decoding complexity approximately equal to separately decoding the codes.

SUMMARY OF THE INVENTION

A trellis encoder according to the present invention has unequal error correction. A multiplexing switch partitions an information block such as speech into a first portion of information and a second portion of information. A first trellis encoder having a first number of states encodes the first portion of information. A second trellis encoder having a second number of states encodes the second portion of information. An initial state information generator establishes initial conditions for the states of the second trellis encoder based on the states of the first trellis encoder by mapping the states of the first trellis encoder to the second trellis encoder. A delay delays the second portion of information from processing by the second trellis encoder until the initial state information generator has mapped the states of the first trellis encoder to the second trellis encoder. A decoder in a system decodes data from the squished trellis encoder using either the above squished approach or other alternate approach.

The details of the preferred embodiments of the invention may be readily understood from the following detailed description when read in conjunction with the accompanying drawings wherein:

DETAILED DESCRIPTION OF THE PREFERRED EMBODIMENTS

Adaptive multi-rate speech coders impose new challenges for forward error correction (FEC) techniques. It is shown that traditional forward error correction techniques become infeasible for ensuring excellent quality of speech within defined complexity limits. A new forward error correction technique, called squished convolutional codes, provides superior error protection performance while satisfying complexity constraints.

A proposed solution is a squished convolutional code consisting of at least two constituent convolutional codes and at least two numbers of states. For example, one convolutional code can have 64 states and a second code has 16 states. In a preferred embodiment, the number of tail bits added is determined by the code with the largest depth. A special circuit/algorithm connects (squishes) the individual convolutional encoders so that the overhead due to tailing is reduced. Another special circuit/algorithm is employed for decoding a squished code on a single trellis. This decoding circuit allows maximum likelihood or maximum a posteriori (MAP) decoding without having the performance loss associated with tail-biting decoders.

Figure 1:
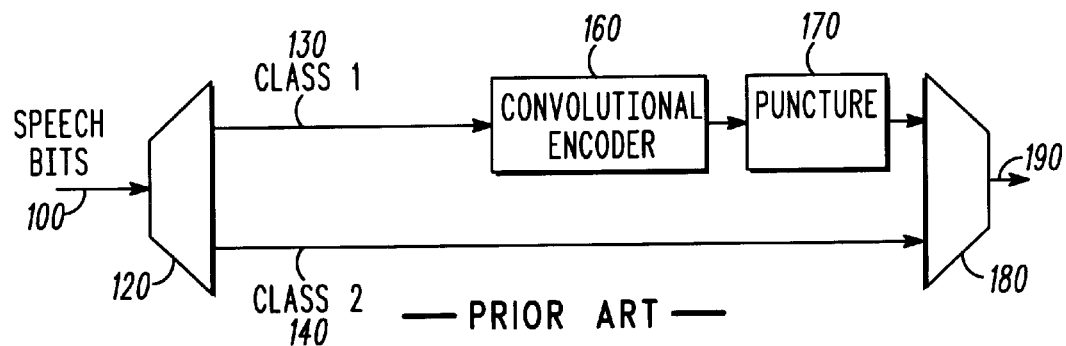
FIG. 1 illustrates a schematic block diagram of a prior art unequal error protection encoder for speech coding.
Figure 2:
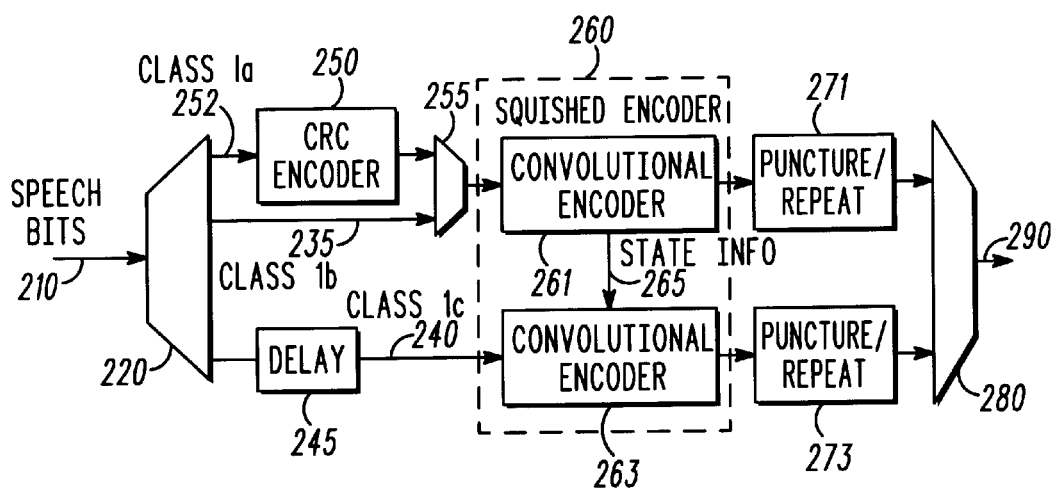
FIG. 2 illustrates a schematic block diagram of a squished code unequal error protection encoder applied to speech coding according to the present invention.

FIG. 2 illustrates a schematic block diagram of a squished unequal error protection encoder applied to a speech-coded information block. In this embodiment, speech bits 210 are one type of information block. Other examples of information blocks include video streams, speech and video streams, and audio-visual streams. More examples of where this invention can be applied include information blocks that can be partitioned using human perceivable characteristics such as, for example, image quality and speech quality.

The multiplexing switch 220 partitions the speech bits 210 using human perceivable characteristics into a class 1 block 252, a class 1b block 235, and a class 1c block 240. In a preferred embodiment the class 1c block 240 represents perceptually significant speech bits 210, the class 1b block 235 represents perceptually more significant speech bits 210, and the class 1a block 252 represents the perceptually most significant speech bits 210. In a preferred embodiment, the class 1 block 252 is processed using a cyclic redundancy check (CRC) encoder 250. The output of CRC encoder 250, in a preferred embodiment, can be used for error detection and/or error concealment scheme. The class 1b block 235 and the output of the CRC encoder 250 are combined using multiplexer 255. An alternate embodiment may also include an uncoded class 2 block 140. In general the multiplexing switch 220 can partition an information block into at least two portions using human perceivable characteristics. In one embodiment, one portion may be uncoded, such as the class 2 bits. In another embodiment, one portion can itself be partitioned using human perceivable characteristics into smaller portions. In one example, the class 1 bits can be partitioned in the class 1a block 252, a class 1b block 235, and a class 1c block 240.

A squished encoder 260 processes the output of multiplexer 255 and the class 1c block 240. In a preferred embodiment, a delay 245 delays the processing of the class 1c block 240 by the squished encoder 260. The amount of the delay introduced by block 245 can be related to the processing within the squished encoder 260.

In one embodiment of the invention, the squished encoder 260 comprises at least two trellis encoders and at least one state information passage between the trellis encoders. In a preferred embodiment the number of passages of state information is related to the number of trellis encoders. A trellis code is a code that can be described using a trellis diagram. A trellis encoder applies the trellis code to an information block. The term trellis code and trellis encoder can be used interchangeably. One example of a trellis encoder is a convolutional encoder. Another example of a trellis code is a turbo code. A further example of a trellis code is a block code such as a BCH code. Yet another example of a trellis code is low density parity check (LDPC) code. With at least two trellis encoders, the squished trellis encoder can provide unequal error protection (UEP). The number of states can be related to a degree of error protection. For example, a trellis code with many states can have better error performance than a trellis code with fewer states. By combining a trellis code having many states with a trellis code having fewer states, the squished code can have unequal error protection by design.

The squished encoder 260 is one example of the squished code. As FIG. 2 illustrates, the squished encoder 260 comprises a first convolutional encoder 261, a second convolutional encoder 263, and a state information passage 265. The state information passage 265 generates initial conditions for the states of the convolutional encoder 263 based on the states of the convolutional encoder 261. Trellis codes process a block of information based on some initial condition, such as an initial state, and a trellis diagram. A convolutional code is an example of a trellis code. A trellis code can be described using a trellis diagram, which can include states and branches between states. Any coder that can be described with a trellis is a trellis coder. For example, the trellis diagram identifies states and possible paths between states. The paths between states, in one example, can be related to the information block. The state information passage 265, in a preferred embodiment, serves to pass the initial conditions for convolutional encoder 263 based on convolutional encoder 261. In one embodiment of the invention, the squished encoder 260 first encodes one block using the first trellis encoder followed by processing the second block with the second trellis encoder.

Thus, convolutional encoder 261 first processes the output of block 255. In a preferred embodiment the output of multiplexer 255 represents a perceptually more important block of information. After the output of multiplexer 255 is processed by convolutional encoder 261, the convolutional encoder 261 can generate a partial termination sequence. In a preferred embodiment where both trellis encoders of the squished encoder 260 are convolutional encoders, such as convolutional encoder 261 and convolutional encoder 263, the length of the partial termination sequence can be related to the number of states in convolutional encoder 261 and convolutional encoder 263. The partial termination sequence, in a preferred embodiment, can reduce the number of possible states in convolutional encoder 261 when convolutional encoder 261 has more states than convolutional encoder 263 does. Further, when convolutional encoder 261 has more states than convolutional encoder 263 does, the partial termination sequence has a length greater than zero. In general, when the final number of states in the first trellis encoder (e.g., the number of possible states after the first information block is encoded by the first trellis encoder) is greater than the number of possible initial states for the second trellis encoder, a partial termination sequence has length greater than zero. In one embodiment, when a trellis encoder is a convolutional code, the initial number of possible states is typically equal to the final number of possible states.

The state of the convolutional encoder 261 is conveyed to convolutional encoder 263 using state information passage 265, in a preferred embodiment, after the partial termination sequence is encoded by convolutional encoder 261. In another example when the partial termination sequence has zero length, the state of the convolutional encoder 261 is conveyed to convolutional encoder 263 after the output of multiplexer 255 is processed by convolutional encoder 261.

The output of convolutional encoder 261 is then processed by the puncture/repeat block 271. In a preferred embodiment, the puncture/repeat block 271 provides additional unequal error protection to an information block. The output of the puncture block 271 and output of the puncture block 273 are then combined using a multplexer 280 to produce an information block with unequal error protection 290.

Convolutional encoder 263 uses the initial conditions conveyed over state information passage 265 to initialize its state before it can begin processing the class 1c block 240. The delay introduced by block 245 in a preferred embodiment is related to when the state of the convolutional encoder 261 is conveyed to convolutional encoder 263. The output of convolutional encoder 263 is then processed by the puncture/repeat block 273. In a preferred embodiment, the puncture/repeat block 273 provides additional unequal error protection to an information block.

Before any initial condition is applied to the second trellis encoder, (e.g., convolutional encoder 263), the final possible states of the first trellis encoder (e.g., convolutional encoder 261) are processed using an initial state information generator. One example of the processing of the initial state information generator is to map the final possible states of the first trellis encoder (e.g., convolutional encoder 261) to possible initial states of the second trellis encoder (e.g., convolutional encoder 263).

Figure 3:
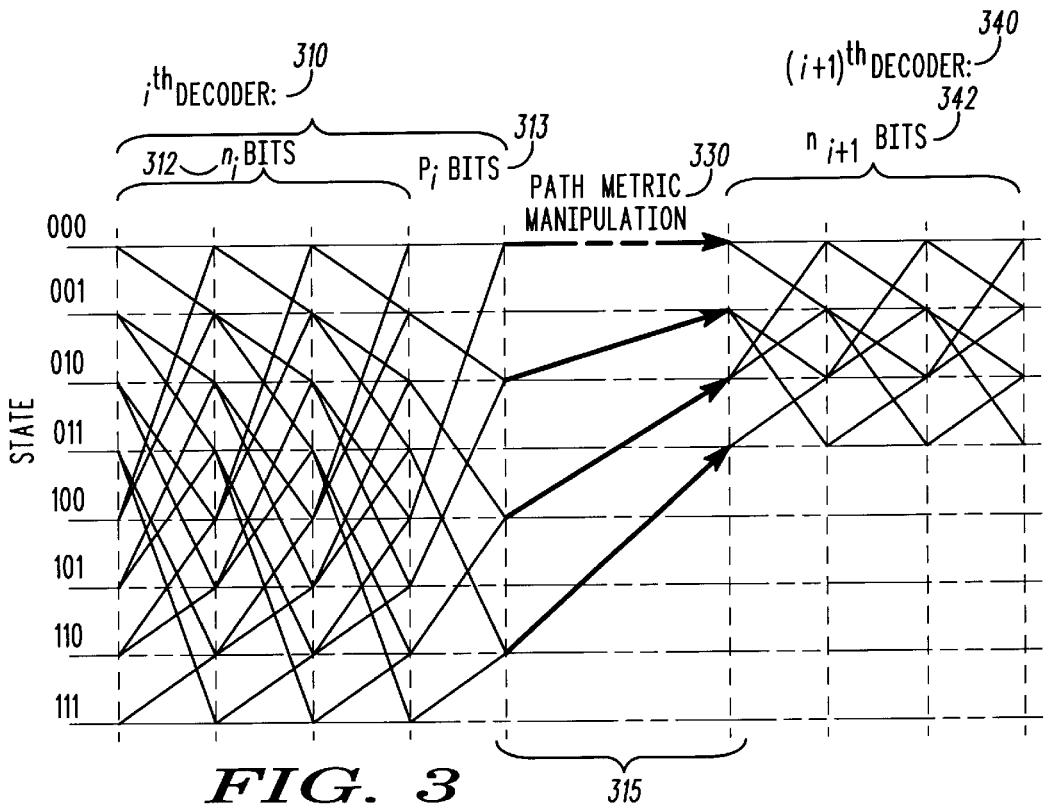
FIG. 3 illustrates a trellis diagram for a squished decoder according to the present invention.

FIG. 3 illustrates a trellis diagram for a squished decoder. The squished code is itself a trellis code and comprises at least two trellis coders. The trellis codes can be labeled 1, 2, . . . , i, i+1, . . . , L. The transition 315 between the ith and (i+1)th code can be shown using a trellis decoder diagram in FIG. 3 when the final number of states in the ith decoder 310 is greater than the initial number of states in the (i+1)th decoder 340. A trellis decoder diagram, in one example, describes all the possible paths that a trellis encoder can traverse. A trellis decoder, in one example, uses a trellis diagram that is similar to the trellis diagram for the encoder.

For instance if a trellis code is a convolutional code, two examples of conventional decoders (i.e., trellis decoders) are a convolutional decoder and a maximum a posteriori (MAP) (or similar variants such as a log-MAP, max-log-MAP) decoder. In another example, a trellis diagram for a decoder is a mirror of the trellis diagram for the encoder. As shown in FIG. 3, the ith decoder 310 is for an 8-state convolutional code. In general the ith decoder 310 can have more or fewer states. FIG. 3 illustrates an embodiment where the number of states in the ith decoder 310 is uniform for the $n_i$ bits 312 of the ith portion of an information block. Further, the ith trellis decoder 310 can be for any type of code that can be represented by a trellis, such as for example, a convolutional code, a BCH code, a turbo code, and LDPC code. The (i+1)th decoder 340 is for a 4-state convolutional code. Again, (i+1)th decoder 340 can, in general, have more or fewer states. Further, the (i+1)th trellis decoder 340 can be for any type of code that can be represented on a trellis, such as for example, a convolutional code, a BCH code, a turbo code, and a LDPC code. FIG. 3 illustrates an embodiment where the number of states in the (i+1)th decoder 340 is uniform for the $n_{i+1}$ bits 342 of the (i+1)th portion of an information block. In general, the number of states of the ith decoder 310 can be different from the number of states in the (i+1)th decoder. In FIG. 3, the final number of possible states of the ith decoder (after the $n_i$ bits 312) is greater than the initial number of possible states in the (i+1)th decoder 340. As FIG. 3 illustrates, the ith decoder 310 has states labeled "000" (which represents numerical 0) through "111" (which represents numerical 7). In contrast, the (i+1)th decoder 340 has states labeled "000" through "011 (which represents numerical 3). The ith decoder 310 spans $n_i$ information bits 312 and a length $p_i$ partial termination sequence 313. The (i+1)th decoder spans $n_{i+1}$ information bits 342. In this example, the (i+1)th decoder 340 does not have a partial termination sequence. In general, a partial termination sequence with length greater than zero is generated when the number of possible states after the $n_i$th bit is encoded (decoded) is greater than the number of possible states before the first bit of the (i+1)th code is processed. Since not every state in the ith decoder 310 is possible in the (i+1)th decoder 340, the number of possible states in the ith decoder 310 is reduced to equal the number of states in the (i+1)th decoder 340 by using a partial termination sequence. In one example, the partial termination sequence makes the final number of possible states in the ith decoder 310 equal to the initial number of states in the (i+1)th decoder 340 but the state numbering in the ith decoder 310 does not coincide with the state numbering in the (i+1)th decoder 340.

For example, when the ith code is a non-systematic non recursive (NSNR) convolutional code, an example of a partial termination sequence of length $p_i$ 313 is binary 0 repeated length $p_i$ 313 times. In another example, when the ith code is a systematic recursive (SR) convolutional code, an example of a partial termination sequence of length $p_i$ 313 is related to the final state (after the $n_i$th bit 312 bit is processed) and the feedback polynomial, as will be understood by those skilled in the art.

As FIG. 3 illustrates, the state numbering in ith decoder 310 (encoder) after the partial termination sequence is decoded is numerical 0, 2, 4, 6 (corresponding to "000", "010", "100", and "110" respectively) while the state numbering in (i+1)th decoder 340 (encoder) is numerical 0, 1, 2, 3. A state mapping function re-labels the state numbering in the ith decoder 310 (encoder) from 0 to 0, 2 to 1, 4 to 2, and 6 to 3. For example, this re-labeling can be described using C code when the ith and (i+1)th trellis codes are convolutional codes and the state of the ith code is described by an $m_i$-tuple bit $x_i$ in Eq. (1)

$$x_{i+1} = (x_i \gg (m_i - m_{i+1})) \& \underbrace{((1 \ll m_{i+1}) - 1)}_{mask}, \qquad \text{Eq. (1)}$$

where $m_i$ is related to $\log_2$ of the number of states in the ith decoder 310. The ">>" is a right shift operator, the "<<" is a left shift operator, and the "&" is a logical AND operator. In the decoder the re-labeling process is called path metric manipulation 330. In the encoder, a state mapping function comprises the re-labeling process. Another reason for re-labeling the path metrics is that this step facilitates most hardware and software decoders' implementations because these implementations assume that valid (possible) states are ordered sequentially. FIG. 3 illustrates one benefit of the invention. Since the complexity of the decoder is proportional to the number of states and number of bits processed, the squished code allows for a low complexity decoder because the total number of possible states is reduced.

Figure 4:
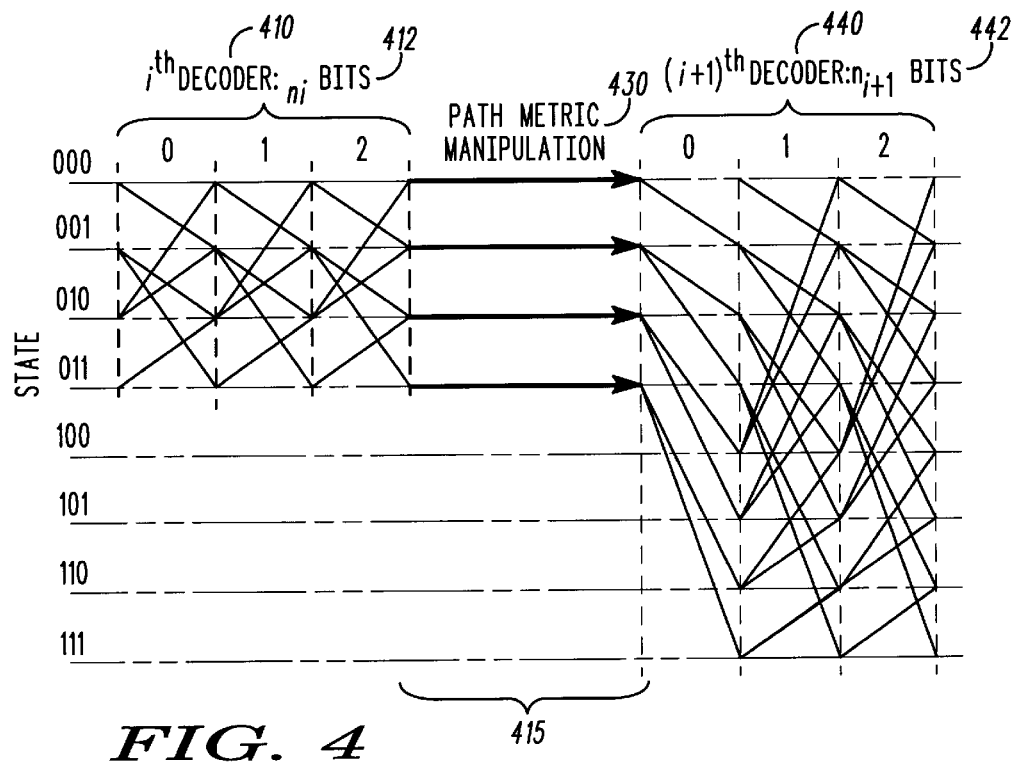
FIG. 4 illustrates a trellis diagram for an alternative squished decoder according to the present invention.

FIG. 4 illustrates a trellis diagram for an alternative squished decoder. A example transition 415 is illustrated between the ith and (i+1)th code using a trellis decoder diagram when the number of states in the ith decoder 410 is less than or equal to the number of states in the (i+1)th decoder 440. As shown in FIG. 4, the ith decoder 410 is for a 4-state convolutional code. However, in general the ith decoder 410 can have more or fewer states. FIG. 4 illustrates an embodiment where the number of states in the ith decoder 410 is uniform for the $n_i$ bits 412 of the ith portion of an information block. Further, the ith decoder 410 can be for any type of code that can be represented on a trellis, such as, for example, a convolutional code, a BCH code, a turbo code, and a LDPC code. In FIG. 4, the (i+1)th decoder 440 is for an 8-state convolutional code. Again, (i+1)th decoder 440 can, in general, have more or fewer states. In general, the number of states of the ith decoder 410 can be different from the number of states in the (i+1)th decoder 440. FIG. 4 illustrates an embodiment where the number of states in the (i+1)th decoder 440 is uniform for the $n_{i+1}$ bits 442 of the (i+1)th portion of an information block. Further, the (i+1)th decoder 440 can be for any type of code that can be represented on a trellis, such as, for example, a convolutional code, a BCH code, a turbo code, and a LDPC code. As FIG. 4 illustrates, the ith decoder 410 has states labeled "000" (which represents numerical 0) through "011" (which represents numerical 3). In contrast, the (i+1)th decoder 440 has states labeled "000" through "111" (which represents numerical 7). The ith decoder 410 spans $n_i$ information bits 412. The (i+1)th decoder 440 spans $n_{i+1}$ information bits 442. In this example, a partial termination sequence is not necessary for the ith code since the final number of possible states after the $n_i$th bit is encoded (decoded) is less than or equal to the initial number of possible states before the first bit of the (i+1)th code is processed. Since every state in the ith decoder 410 is possible in the (i+1)th decoder 440, the final number of possible states in the ith decoder 410 must be increased to equal the initial number of states in the (i+1)th decoder 440. In the decoder, path metric manipulation 430 is an identity function, as no re-labeling is necessary. As FIG. 4 illustrates a state mapping function maps states 0,1, 2, 3 of the ith decoder 410 to states 0, 1, 2, and 3 for the (i+1)th decoder 440. States 4, 5,6, and 7 of the (i+1)th decoder 440 may not be initialized. In another example, states 4, 5, 6, and 7 of the (i+1)th decoder 440 may be initialized to values that may not be possible to attain in a decoder or that indicates certain states are unlikely. FIG. 4 illustrates one benefit of the invention. Since the complexity of the decoder is proportional to the number of states and number of bits processed, the squished code allows for a low complexity decoder because the total number of possible states is reduced.

Figure 5:
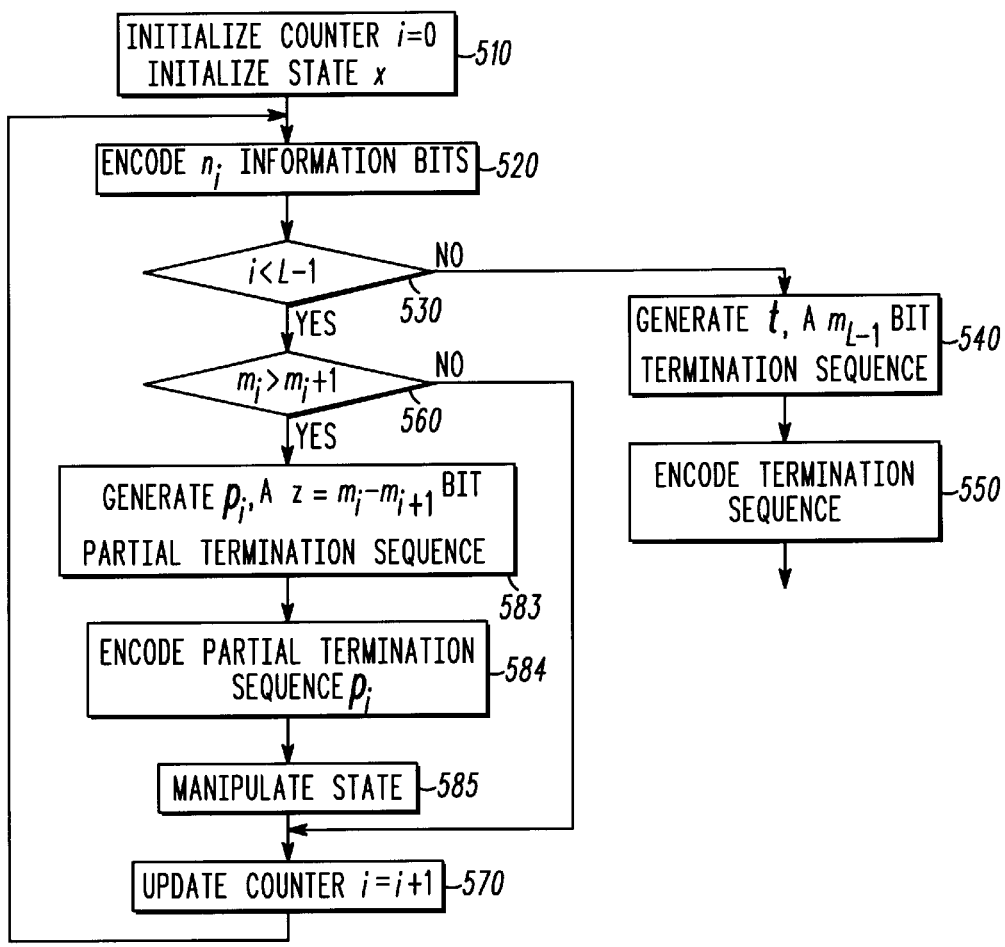
FIG. 5 illustrates a flowchart for a squished encoder according to the present invention.

FIG. 5 illustrates a flowchart for a generalized squished encoder that has at least L trellis encoders. The L trellis encoders, in this example, can be any combination of systematic recursive (SR) convolutional encoders and non-systematic non-recursive (NSNR) convolutional encoders. The ith convolutional encoder has $2^{m_i}$ states and operates over $n_i$ bits. For simplicity of description, x can represent a vector (shift register) that represents the state of the squished encoder. In this embodiment, x has $\max(m_0, m_1, \ldots, m_{L-1})$ elements (bits). In a preferred embodiment, $m_0 \geq m_1 \geq \ldots \geq m_{L-1}$. In this embodiment, the number of states in the ith trellis encoder is greater than or equal to the number of states in the (i+1) trellis encoder. This embodiment can minimize the overhead to $m_0$ bits. In another embodiment, $m_0 \leq m_1 \leq \ldots \leq m_{L-1}$. For this embodiment, the number of states in the ith trellis encoder is less than or equal to the number of states in the (i+1) trellis encoder. This embodiment can minimize the overhead to $m_{L-1}$ bits.

Block 510 may initialize x to 0 (e.g., the initial conditions for the first encoder is 0) and loop counter i to 0. In this embodiment, an information block is partitioned into L portions of information. In 520, an information block of $n_i$ bits may be encoded with the ith convolutional encoder. Block 530 may check if i is less than L−1. If i is less than L−1, block 560 may check if $m_i$ is greater than $m_{i+1}$. If $m_i$ is greater than $m_{i+1}$, block 583 may generate a partial termination sequence $p_i$ that has length $m_i - m_{i+1}$ bits. Block 584 may then encode the partial termination sequence $p_i$ produced in block 583 to reduce the number of possible states in the ith encoder from $2^{m_i}$ to $2^{m_{i+1}}$. The $2^{m_{i+1}}$ possible states may not be numerically sequential. In one example, the difference in the state numbering between two successive possible states may be $2^{m_i - m_{i+1}}$. In another example when $m_i=6$ and $m_{i+1}=4$, the state numbering after the partial termination sequence may be 0, 4, 8, 12, . . . , 56, 60. Block 585 may then map the $2^{m_{i+1}}$ permissible states to linear sequential order. For example for $m_i=6$ and $m_{i+1}=4$, the states after mapping become 0, 1, 2, . . . , 15. Block 570 may set i=i+1. If i is greater than or equal to L−1, block 540 may generate a termination sequence with length $m_{L-1}$. Block 550 may encode the termination sequence. A termination sequence, in one example, reduces the number of possible states to one. For example, when the (L−1)th code is a NSNR convolutional code, an example of a termination sequence of length $m_{L-1}$ is binary 0 repeated length $m_{L-1}$ times. In another example, when the (L−1)th code is an SR convolutional code, an example of a termination sequence of length $m_{L-1}$ is related to the final state (after the $n_{L-1}$th bit is processed) and the feedback polynomial, as will be understood by those skilled in the art.

Although the invention has been described and illustrated in the above description and drawings, it is understood that this description is by example only, and that numerous changes and modifications can be made by those skilled in the art without departing from the true spirit and scope of the invention. Although the examples in the drawings depict only a four state trellis diagram, different numbers and kinds of states can be supported by the squished code encoder and decoder of the present invention. The present invention is not limited to speech processing or radio devices but can be applied as described to multiple data types and transmission mediums.

What is claimed is:

1. A trellis encoder apparatus having unequal error correction, comprising:
   a multiplexing switch to partition an information block into a first portion of information and a second portion of information;
   a first trellis encoder having a first number of states and operatively coupled to the multiplexing switch to encode the first portion of information;
   a second trellis encoder having a second number of states and operatively coupled to the multiplexing switch to encode the second portion of information; and
   an initial state information generator operatively coupled between the first trellis encoder and the second trellis encoder to establish initial conditions for the states of the second trellis encoder based on the states of the first trellis encoder by mapping the states of the first trellis encoder to the second trellis encoder.

2. A trellis encoder apparatus according to claim 1, further comprising a delay operatively coupled between the multiplexing switch and the second trellis encoder to delay the second portion from processing by the second trellis encoder until the initial state information generator has mapped the states of the first trellis encoder to the second trellis encoder.

3. A trellis encoder apparatus according to claim 1,
   wherein the first trellis encoder comprises a convolutional encoder; and
   wherein the second trellis encoder comprises a convolutional encoder.

4. A trellis encoder apparatus according to claim 1, wherein the first trellis encoder has a larger number of states than the second trellis encoder.

5. A trellis encoder apparatus according to claim 4, further comprising a partial termination sequence generator operatively coupled to the first trellis encoder and the initial state information generator to reduce a number of states output of the first trellis encoder to match the number of states of the second trellis encoder.

6. A trellis encoder apparatus according to claim 1, wherein the multiplexing switch partitions the information block into the first and second portions of information based on human perceivable characteristics so that one of the trellis encoders gets more human perceivable portions than the other.

7. A trellis encoding and decoding system, comprising:
   a squished trellis encoder including
   a multiplexing switch to partition an information block into a first portion of information and a second portion of information;
   a first trellis encoder having a first number of states and operatively coupled to the multiplexing switch to encode the first portion of information;
   a second trellis encoder having a second number of states and operatively coupled to the multiplexing switch to encode the second portion of information; and
   an initial state information generator operatively coupled between the first trellis encoder and the second trellis encoder to establish initial conditions for the states of the second trellis encoder based on the states of the first trellis encoder by mapping the states of the first trellis encoder to the second trellis encoder;
   a decoder to decode data from the squished trellis encoder.

8. A system according to claim 7, wherein the decoder operates over the possible states of the squished trellis encoder and thereby its trellis diagram is a mirror image of the squished trellis encoder.

9. A system according to claim 7, wherein the decoder is a conventional decoder.

10. A system according to claim 7, wherein the multiplexing switch partitions the information blocks into the first and second portions of information based on human perceivable characteristics so that one of the trellis encoders gets more human perceivable portions than the other.

* * * * *